United States Patent [19]

Tseng

[11] Patent Number: 5,801,082
[45] Date of Patent: Sep. 1, 1998

[54] METHOD FOR MAKING IMPROVED SHALLOW TRENCH ISOLATION WITH DIELECTRIC STUDS FOR SEMICONDUCTOR INTEGRATED CIRCUITS

[75] Inventor: Horng-Huei Tseng, Hsinchu, Taiwan

[73] Assignee: Vanguard International Semiconductor Corporation, Hsin-Chu, Taiwan

[21] Appl. No.: 912,322

[22] Filed: Aug. 18, 1997

[51] Int. Cl.$^6$ ................................................ H01L 21/76
[52] U.S. Cl. .................... 438/424; 438/433; 438/428; 438/782; 148/DIG. 50
[58] Field of Search ............................. 438/424, 427, 438/428, 435, 433, 782; 148/DIG. 50

[56] References Cited

U.S. PATENT DOCUMENTS

| | | | |
|---|---|---|---|
| 5,372,968 | 12/1994 | Lur et al. | 437/67 |
| 5,506,168 | 4/1996 | Morita et al. | 438/424 |
| 5,518,950 | 5/1996 | Ibok et al. | 437/67 |
| 5,728,621 | 3/1998 | Zheng et al. | 438/424 |
| 5,731,241 | 3/1998 | Jang et al. | 148/DIG. 50 |

OTHER PUBLICATIONS

P.C. Fazan et al. "A Highly Manufacturable Trench Isolation Process for Deep Submicron DRAMs" in Proceedings of the International Electronic Device Meeting 1993, pp. 57–60. (No Month).

*Primary Examiner*—Trung Dang
*Attorney, Agent, or Firm*—George O. Saile; Stephen B. Ackerman

[57] ABSTRACT

A method is achieved for making improved shallow trench isolation (STI) regions surrounding and electrically isolating device areas on a substrate using dielectric studs, spin-on-glass (SOG), and an isotropic wet etchback. The method consists of forming trenches in a silicon substrate using a pad oxide and silicon nitride mask. A thermal oxide is grown in the silicon trenches and a CVD silicon oxide is deposited and chemical/mechanically polished back to the silicon nitride masking layer to form dielectric studs (or plugs) in the silicon trenches that extend above the silicon substrate surface. The silicon nitride is removed in hot phosphoric acid, and a thin SOG is deposited to form disposable sidewall spacers on the raised studs. The thin SOG and the pad oxide are wet etched in HF acid to the device areas while isotropically etching back the disposable SOG sidewall spacers and dielectric studs to form shallow trench isolation regions having a raised convex surface. This eliminates dishing in the STI (concave STI) that results in undesirable variation in FET threshold voltage ($V_{th}$). The gradual convex profile also minimizes the polysilicon residue problem when anisotropically etching the gate electrodes over the device areas. The use of SOG with wet etchback is more cost effective than the conventional CVD oxide deposition and plasma etchback process.

26 Claims, 3 Drawing Sheets

METHOD FOR MAKING IMPROVED SHALLOW TRENCH ISOLATION WITH DIELECTRIC STUDS FOR SEMICONDUCTOR INTEGRATED CIRCUITS

BACKGROUND OF THE INVENTION

(1) Field of the Invention

The present invention relates to the fabrication of integrated circuits, and more particularly to a method for forming improved raised shallow trench isolation (STI) regions around device areas. Dielectric plugs are formed in trenches and a spin-on-glass (SOG) coating and a wet etchback are used to form raised oxide isolation regions. This new method eliminates corner effects at the edges of the device areas that can degrade FET electrical characteristics, while providing a more cost-effective manufacturing process.

(2) Description of the Prior Art

Field OXide (FOX) isolation regions are used to electrically isolate the discrete devices, such as field effect transistors (FETs) in Ultra Large Scale Integration (ULSI) circuits on semiconductor chips formed from silicon substrates. One conventional approach in the semiconductor industry for forming field oxide isolation is by the LOCal Oxidation of Silicon (LOCOS) method. LOCOS uses a patterned silicon nitride ($Si_3N_4$) as an oxidation barrier mask, and the silicon substrate is selectively oxidized to form the semiplanar isolation. However, this method requires long oxidation times (thermal budgets), and lateral oxidation under the barrier mask limits the minimum spacing between adjacent active device areas, and therefore prevents further increase in device packing density.

One method of circumventing the LOCOS limitations and to further reduce the field oxide (FOX) minimum feature size is to use shallow trench isolation (STI). One method of making shallow trench isolation is to first etch trenches having essentially vertical sidewalls in the silicon substrate. The trenches are then filled with a chemical vapor deposited (CVD) silicon oxide ($SiO_2$), and the CVD oxide is then plasma etched back, or polished back using chemical/mechanical polishing, to form the FOX isolation regions.

However, there are several problems associated with the conventional or prior-art shallow trench isolation methods. For example, if the silicon oxide is etched or polished to the substrate surface, dishing resulting in a concave surfaces of the CVD silicon oxide in the trenches can occur. Unfortunately this results in recesses in the field oxide at the edge of the device areas. Later when the gate electrodes are made for the FETs extending over the device area edge, this results in an undesirable lower and variable threshold voltages ($V_{th}$) when the circuits are completed and power up. Therefore it is desirable to make FOX regions that extend higher than the substrate surface to avoid this problem while reducing manufacturing cost.

One approach for filling trenches with an insulating layer is described by Ibok et al. in U.S. Pat. No. 5,518,980. In this approach the trenches are filled with a spin-on-glass (SOG) which is leveled and has a surface that is higher than the trench. The SOG is then patterned leaving portions in and over the trenches by photoresist masking and etching the SOG over the device areas on the silicon substrate. However, the SOG trench isolation is not self-aligned to the trenches since a photoresist mask is used to pattern the SOG. Another approach is described by P. C. Fazan in the Proceedings of the International Electronic Device Meeting 1993, pages 57–60, in which a chemical vapor deposited (CVD) silicon oxide is used and a plasma etchback is used to make disposable oxide spacers.

Still another approach is described by Lur et al., U.S. Pat. No. 5,372,968, for making shallow trench isolation (STI) of various widths and globally planarized, but requires additional process steps and does not address the recess problem (STI shape) at the edge of the device areas.

Although there are a number of methods for forming shallow trenches, there is still a strong need to provide a cost-effective shallow trench isolation process that avoids the undesirable edge effect mentioned above.

SUMMARY OF THE INVENTION

It is a principal object of this invention to provide a method for making self-aligned raised shallow trench isolation (STI) regions using dielectric studs to provide improved FET threshold voltage ($V_{th}$) characteristics when the circuit is powered on.

It is another object of this invention to make these raised shallow trench isolation regions using a spin-on-glass (SOG) to make disposable sidewall spacers on dielectric studs in the trenches, and to use a wet etchback. This replaces the more conventional chemical vapor deposition (CVD) and plasma etchback process, and therefore provides a more cost-effective manufacturing process.

In accordance with the objects of the invention, a new method is described for forming shallow trench isolation (STI) regions having raised field oxide for improved FET device characteristics. The method is more cost effective than the field oxide isolation formed by the conventional chemical vapor deposited silicon oxide and a plasma etchback process.

The method begins by providing a semiconductor substrate composed of a P-doped single-crystal silicon. The method is also applicable for substrates having N- and P-wells for making both N- and P-channel FETs for Complementary Metal Oxide Semiconductor (CMOS) devices. A pad oxide layer composed of silicon oxide ($SiO_2$) is formed on the substrate as a stress-release layer. Typically the pad oxide is formed by thermal oxidation. A silicon nitride ($Si_3N_4$) layer, commonly used as an oxidation barrier layer, is deposited on the pad oxide layer. Conventional photolithographic techniques, using a photoresist mask and anisotropic plasma etching, are used to etch openings in the $Si_3N_4$ layer and the pad oxide over areas on the substrate where the shallow trench isolation regions are to be formed, while retaining portions of the $Si_3N_4$ layer over the device areas. The photoresist mask is then removed, for example by plasma ashing. The patterned silicon nitride layer is used to partially etch into the silicon substrate to form trenches for the STI that will surround and electrically isolate device areas on the substrate. The exposed surfaces of the silicon substrate in the trenches are thermally oxidized to form a liner oxide. Prior to forming the dielectric studs for the STI, an angled ion implantation is carried out to form a channel-stop in the trenches to prevent surface inversion at the trench oxide/substrate interface, and thereby prevent current leakage between adjacent device areas. The trenches are now filled by depositing a sufficiently thick conformal chemical vapor deposited (CVD) $SIO_2$ to fill the trenches, thereby providing a gap-fill oxide. The gap-fill oxide is then chemically/mechanically polished (CMP) back to the surface of the $Si_3N_4$ layer. The portions of the silicon nitride layer over the device areas are removed by selective etching, using for example, hot phosphoric acid. This results in forming raised dielectric studs (or plugs) in the trenches that extend above the substrate surface. The raised portions of the dielectric studs that extend above the substrate surface have essentially vertical sidewalls. A key feature of the invention is to deposit by spin coating a spin-on glass (SOG) that is thin over the flat (horizontal) surfaces, such as over the device areas and top portions of the studs, while forming a much thicker SOG portion on the vertical sidewalls of the dielectric studs to form disposable sidewall spacers. After curing the spin-on glass by thermal annealing, a wet etchback is used to remove the thin SOG and the pad oxide from the device areas, while concurrently isotropically etching back the raised dielectric studs and the spin-on glass spacers. This results in shallow trench isolation regions having a convex raised surface relative to the surface of the substrate. The convex profile of the STI provides an improved substrate structure on which to form the FET gate electrodes with improved electrical characteristics, while providing a more cost-effective process. The method also provides a gradual slope (or tapering) of the STI at the corners of the active device areas, which provides better edge coverage of a patterned polysilicon layer, which is used next to form the gate electrodes for the FETs.

The gate electrodes for the FETs are now formed by first forming a gate oxide layer on the device areas. The gate oxide can be formed in a conventional manner by thermal oxidation of the exposed silicon device areas. The FET gate electrodes are then formed by depositing a polysilicon layer on the substrate, and is appropriately doped. The polysilicon layer is then patterned using conventional photolithographic techniques and anisotropic plasma etching. The FETs can then be completed using conventional processing. For example, the processing up to the first level of metallization includes forming lightly doped source/drain areas adjacent to the gate electrodes, sidewall spacers on the gate electrodes, and heavily doped source/drain contact areas. The completed FETs are then insulated with an interlevel dielectric layer (ILD), for example using a CVD silicon oxide layer, and contact holes are etched in the ILD, and an electrically conducting layer is deposited and patterned to form the first level of interconnections.

BRIEF DESCRIPTION OF THE DRAWINGS

The objects and other advantages of the preferred embodiment of this invention are best understood with reference to the attached drawings that include.

DESCRIPTION OF THE PREFERRED EMBODIMENT

The method for making the shallow trench isolation regions having dielectric studs (or plugs) formed in shallow trenches is described now in detail. The method provides a shallow trench isolation that is higher than the substrate surface, and has a convex shape, which provides a surface on which FETs with improved electrical characteristics can be built. Although the method is described for a single shallow trench isolation on a silicon substrate, it should be well understood by one skilled in the art that a multitude of shallow trenches is formed concurrently on the substrate. It should be further understood that the trenches can be formed in either P-doped or N-doped substrates. More particularly, the improved field oxide isolation can be formed in and on substrates having both P- and N-wells for forming N-channel and P-channel field effect transistors (FETs) such as are used to fabricate CMOS circuits, dynamic random access memory (DRAM) devices, and the like.

Figure 1:
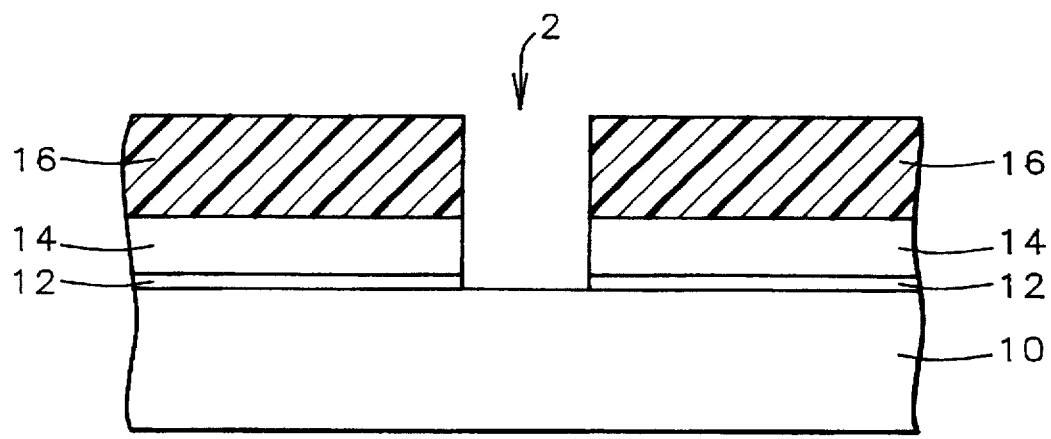
FIGS. 1 through 8 are schematic cross-sectional views showing a sequence of process steps for forming shallow trench isolation (STI) regions using dielectric studs extending above the substrate surface.

Referring to FIG. 1, the method begins by providing a semiconductor substrate 10 composed of a single-crystal silicon. A pad oxide layer 12 composed of silicon oxide ($SiO_2$) is formed on the substrate as a stress-release layer. Generally the pad oxide is formed by thermal oxidation, and is grown to a thickness of between about 200 and 300 Angstroms. A silicon nitride ($Si_3N_4$) layer 14 is deposited on the pad oxide 12. Preferably the $Si_3N_4$ is deposited by low-pressure chemical vapor deposition (LPCVD) using, for example, dichlorosilane ($SiCl_2H_2$) and ammonia ($NH_3$), and is typically deposited at a temperature of between about 700° and 800° C. The $Si_3N_4$ is deposited to a preferred thickness of between about 1500 and 3000 Angstroms. Layer 14 is commonly used as an oxidation barrier layer in the LOCOS method, but in this invention serves as a disposable hard mask for forming the raised dielectric studs for the shallow trench isolation (STI).

Still referring to FIG. 1, a photoresist layer 16 is deposited by spin coating and patterned by conventional photolithographic techniques to have openings 2 over the substrate where the shallow trench isolation is desired. An anisotropic plasma etching is used to etch the $Si_3N_4$ layer 14 and the pad oxide layer 12 to the surface of the silicon substrate 10. Preferably the etching is carried out using a high-density plasma (HDP) etcher or a reactive ion etcher (RIE) using an etchant gas that etches selectively the $Si_3N_4$ 14 and the pad oxide ($SiO_2$) 12 to the substrate 10. For example, a gas mixture containing trifluoromethane ($CHF_3$) and a carrier gas such as argon (Ar) can be used.

Figure 2:
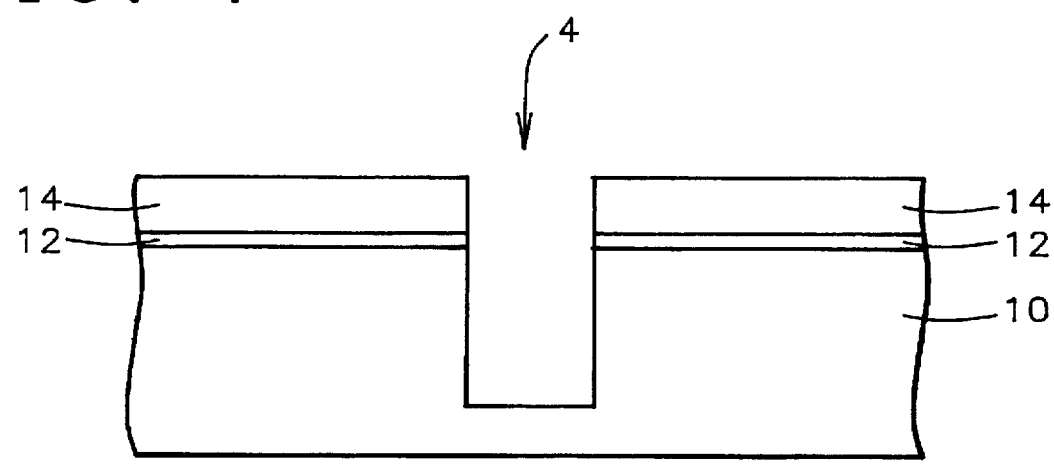

Referring to FIG. 2, the photoresist mask 16 is removed, for example, by plasma ashing in oxygen ($O_2$) and the patterned $Si_3N_4$ 14 is used as an etch mask to form trenches 4 in the silicon substrate 10. The trenches 4 are etched for the STI that will surround and electrically isolate device areas on the substrate. The trenches 4 are anisotropically etched using RIE and a gas mixture which has a high etch-rate selectivity of silicon to silicon nitride, which remains over the device areas as an etch mask. For example, the trenches can be etched using a gas mixture containing a chlorine ($Cl_2$) species to form trenches having essentially vertical sidewalls. The trenches 4 are etched to a depth of between about 3000 and 6000 Angstroms.

Figure 3:
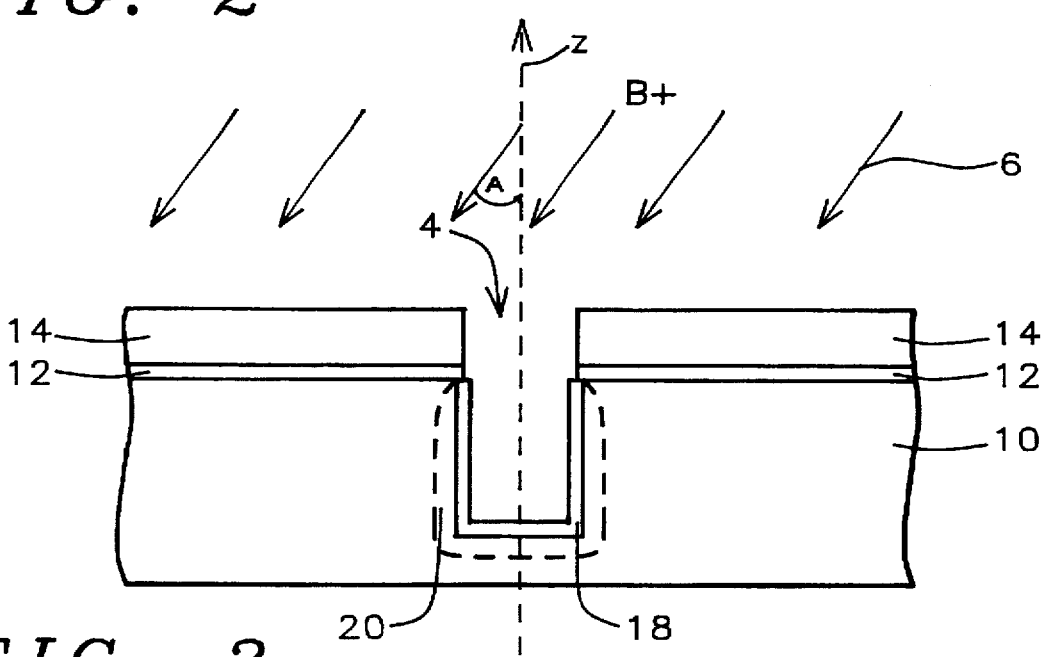

Now referring to FIG. 3, a liner oxide 18 is formed on the surface of the exposed silicon substrate 10 in the trenches 4. The liner oxide is formed by thermal oxidation by exposing the substrate to an oxidizing ambient in an oxidation furnace. For example, the oxidation can be carried out in $O_2$ in a temperature range of between about 800° and 1100° C. The oxidation is performed for a time sufficient to grow a $SiO_2$ of between about 50 and 300 Angstroms. A channel-stop region 20 is formed in the trenches 4 adjacent to the liner oxide 18 using an angled ion implantation 6, as depicted in FIG. 3. The angled implant is performed in an ion implanter by rotating the substrate around an axis Z which is normal to the substrate surface, and at an angle A with respect to the boron ion $B^+$ direction. This angle of rotation ensures that the boron dopant is uniformly distributed along the sidewalls of the trenches 4. Preferably the channel-stop 20 for N-channel FETs is a boron ion ($B^{11}$) implantation. The channel-stop region 20 is used to prevent surface inversion, and therefore prevents leakage current between adjacent device areas.

Figure 4:
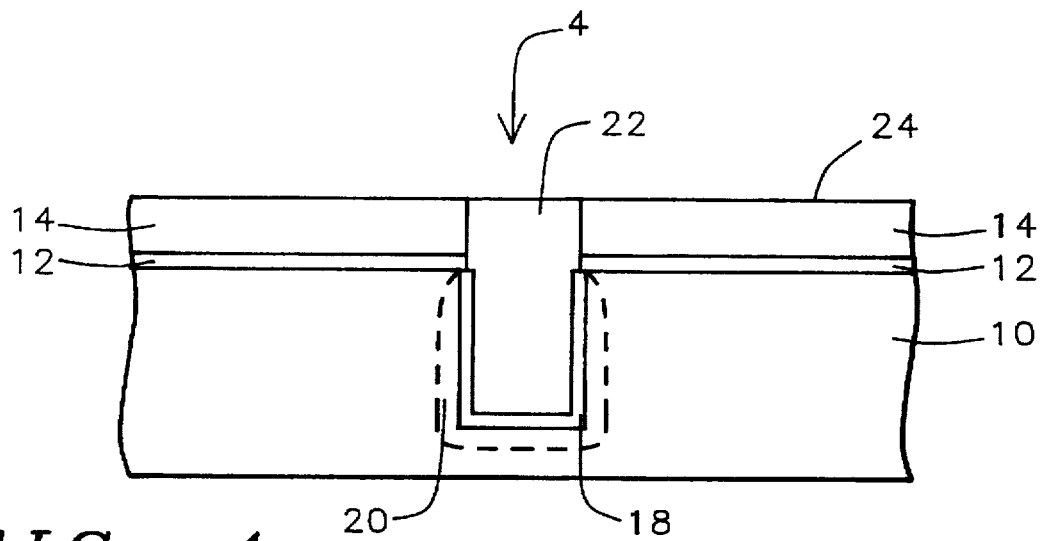

Referring to FIG. 4 and continuing with the process, a conformal CVD silicon oxide layer 22 is deposited to fill the trenches 4, and is chemical/mechanically polished back to the surface of the $Si_3N_4$ layer 14. Preferably the conformal trench-fill $SiO_2$ is deposited using Sub-Atmosphere-CVD (SA-CVD) or a high-density-plasma-CVD (HDP-CVD) and a reactant gas such as tetraethosiloxane (TEOS). Layer 22 is deposited to a thickness sufficient to fill the trenches 4 and to a height that extends above the surface 24 of the $Si_3N_4$ layer 14. If the trench 4 is narrow and has a high aspect ratio (e.g., >1), then layer 22 can be deposited to a thickness that is at least greater than one-half the width of the trench. However, preferably, for trenches 4 with a depth of 3000 to 6000 Angstroms, the CVD silicon oxide 22 is deposited to a thickness of between about 1000 and 10000 Angstroms.

Referring still to FIG. 4, the trench-fill oxide layer 22 is chemical/mechanically polished (CMP) back to the silicon nitride layer 14 to form dielectric plugs 22 from the CVD $SiO_2$ remaining in the trenches 4, while exposing the $Si_3N_4$ surface. The polish-back can be achieved using commercially available polishing equipment and an appropriate polishing slurry. FIG. 4 depicts the structure after the CMP.

Figure 5:
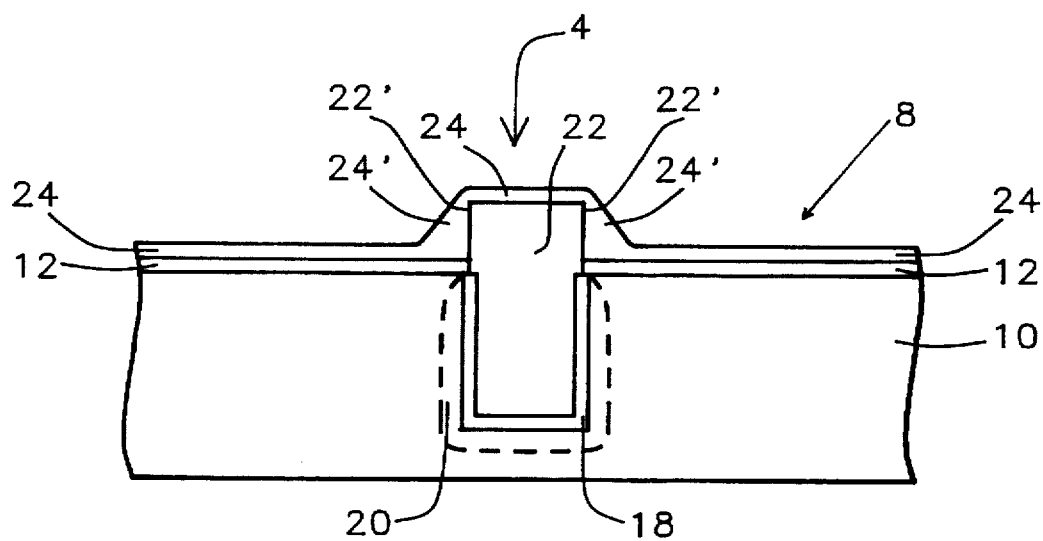

Referring now to FIG. 5, the portions of the silicon nitride layer 14 over the device areas (as depicted in FIG. 4) are removed by selective etching. The selective etching is carried out using, for example, hot phosphoric acid ($H_3PO_4$) at a temperature of between about 155° and 180° C. This results in a dielectric stud 22 having vertical sidewalls 22' extending above the substrate surface by about 1500 to 3000 Angstroms, approximately the thickness of the $Si_3N_4$ layer 14.

Next, and a key feature of the invention, a thin spin-on glass (SOG) 24 is deposited by spin coating. This results in formation of a (SOG) layer that is thinner over the flat (horizontal) surfaces, more specifically over the device areas 8 and on the top portions of the studs 22, while forming a much thicker SOG portion 24' on the vertical sidewalls 22' of the dielectric studs. The portion 24' forms disposable spin-on glass sidewall spacers. Preferably the SOG is a commercially available spin-on-glass polymer such as a siloxane or silicate-based polymer. For example, a SOG such as ACCUGLASS manufactured by Allied Signal, Inc. of California, U.S.A. can be used. The SOG is deposited to a preferred thickness of between about 200 and 1000 Angstroms on the flat (horizontal) surfaces and is then cured at a temperature of between about 200° and 500° C. Since only a thin SOG layer is used to form sidewall spacers and later removed, the usual problems of shrinkage and cracking associated with thicker layers are not a concern. Since the SOG is a disposable layer, contamination from outgasing, as is commonly experienced in the semiconductor industry, is also not a problem.

Figure 6:
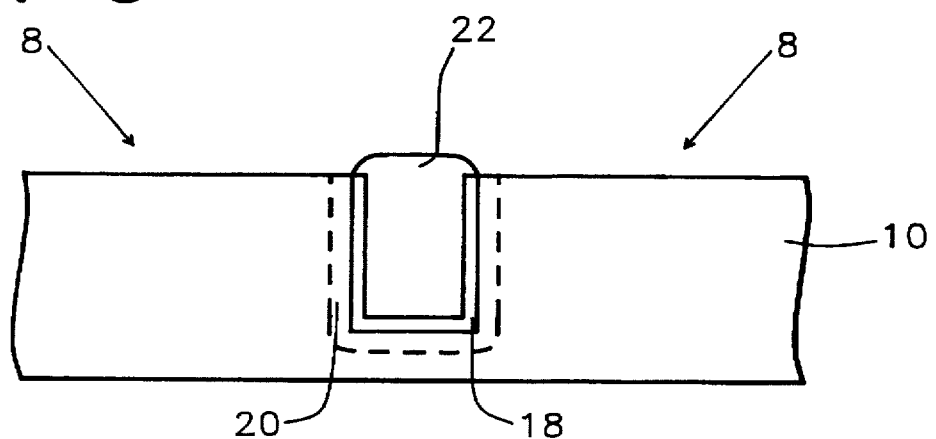

Referring now to FIG. 6, the spin-on glass 24 and the pad oxide 12, in FIG. 5, are etched back isotropically to the surface of the substrate surface 10 using a wet etch. Preferably the wet etch is a dilute hydrofluoric acid (HF) solution. Concurrently the raised dielectric studs 22 are etched back and the spin-on glass spacers 24' are isotropically etched to form the raised STI shown in FIG. 6. This results in shallow trench isolation regions 22 having a convex raised surface relative to surface of the substrate 10, as depicted in FIG. 6. The convex profile of the STI provides an improved substrate structure on which to form the FET gate electrodes with improved electrical characteristics, while providing a more cost-effective process than the conventional method that uses a CVD oxide deposition and a plasma etchback, as cited in the paper by P. C. Fazan, in the proceedings of IEDM 1993, pages 57–60. The method of this present invention using the SOG also provides a more gradual slope (or tapering) of the shallow trench isolation 22 at the corners of the active device areas, which provides better edge coverage of the polysilicon layer used later to form the FET gate electrodes. Also, since the STI dielectric plugs 22 are higher than the substrate surface 10, the problem of lower and varying FET threshold voltages ($V_{th}$) due to the higher electric fields (E) at the recessed STI near device area edges is avoided when the completed circuit is powered-up and a gate voltage ($V_g$) is applied to the gate electrodes.

Figure 7:
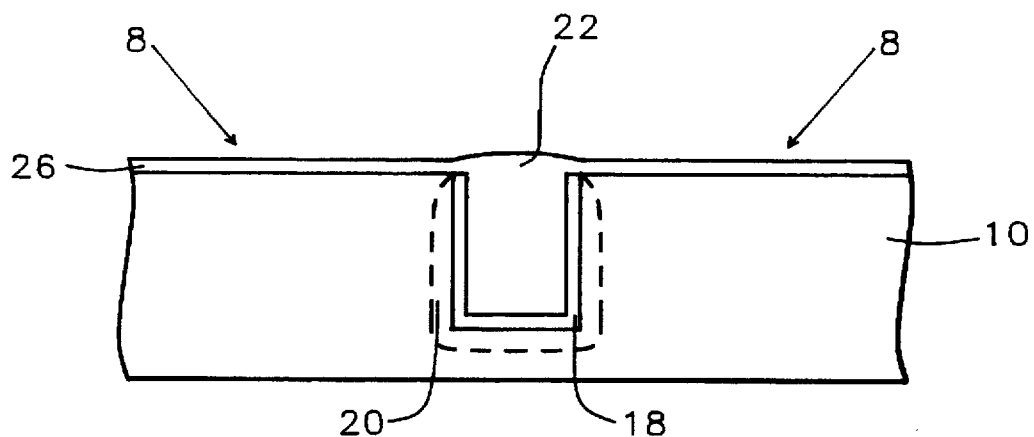
Figure 8:
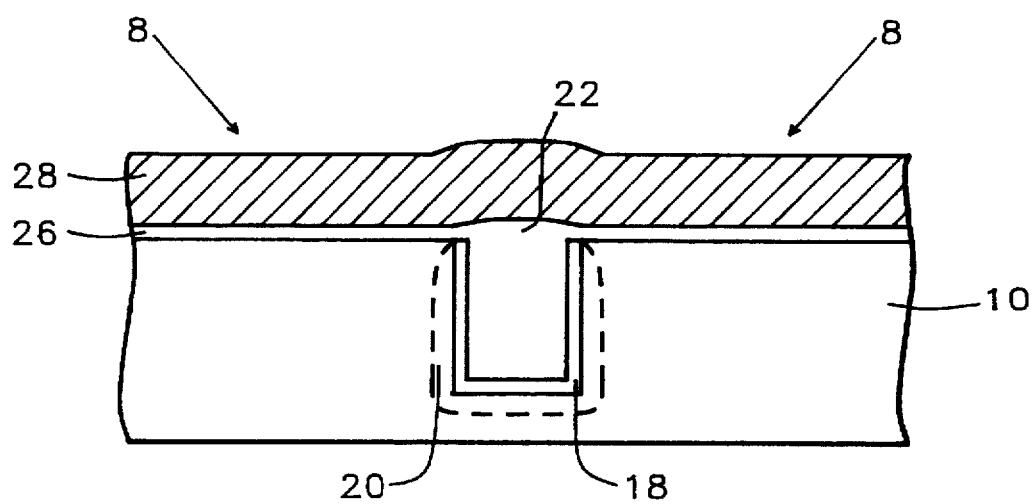

To better appreciate the advantages of this new and improved shallow trench isolation 22, the formation of a conventional commonly shared FET gate electrode over two adjacent device areas 8 separated by a shallow trench isolation (STI) region 22 is now described and depicted in FIGS. 7 and 8. Referring to FIG. 7, a gate oxide 26 is formed by conventional means on the device areas 8. For example, the oxide 26 can be formed by thermal oxidation in an oxygen ambient (dry oxidation), and is grown to a preferred thickness of between about 50 and 200 Angstroms.

Now as shown in FIG. 8, a polysilicon layer 28 is deposited, for example, by LPCVD using silane ($SiH_4$) as the reactant gas and then layer 28 is appropriately doped. For an N-channel FET, polysilicon layer 28 would be doped $N^+$ with arsenic (As) or phosphorus (P) by ion implantation, or in-situ doped during the polysilicon deposition using a dopant gas such as arsine ($AsH_3$) or phosphine ($PH_3$). Typically layer 28 is deposited to a thickness of between about 1000 and 3500 Angstroms. The polysilicon layer 28 is then patterned using conventional photolithographic techniques and plasma etching to form the gate electrode 28. The cross section through the gate electrode 28 in FIG. 8 is along the FETs channel width, and therefore does not depict the FET source/drain areas. As can be clearly seen in FIG. 8, the raised convex shallow trench isolation 22 results in a gradually sloped polysilicon gate electrode that is free of high electric field (E) effects that would otherwise occur for dished or concave STI structures. The gradual slope almost minimizes the formation of polysilicon residue along the STI/device area edge between closely spaced polysilicon lines that would otherwise occur at steeper steps when anisotropic plasma etching is used to pattern the closely spaced gate electrodes. Further, the use of a spin-on-glass 24 (FIG. 5) and a wet isotropic etchback (FIG. 6) reduce the manufacturing cost over the more conventional use of a CVD oxide and a plasma etchback.

Also not shown in FIG. 8, the FETs and integrated semiconductor circuit are then completed up to the first level of metallization using conventional processing steps. For example, the FETs are completed by forming lightly doped drain areas, sidewall spacers and heavily doped source/drain contacts. The FETs are then insulated by depositing a CVD oxide in which contact holes are etched to the devices and an electrically conducting layer is deposited and patterned to form the first level of metal interconnections.

While the invention has been particularly shown and described with reference to the preferred embodiments thereof, it will be understood by those skilled in the art that various changes in form and details may be made without departing from the spirit and scope of the invention.

What is claimed is:

1. A method for fabricating raised shallow trench isolation regions in a semiconductor substrate comprising the steps of:

forming a pad oxide layer composed of silicon oxide on said substrate;

depositing a silicon nitride layer on said pad oxide layer;

forming openings in said silicon nitride layer and said pad oxide layer surrounding device areas using a photoresist mask and anisotropic plasma etching;

removing said photoresist mask;

forming trenches by selectively anisotropic plasma etching said silicon substrate in said openings while leaving portions of said silicon nitride layer over said device areas;

forming a liner oxide by thermal oxidation on exposed surfaces of said trenches in said substrate;

forming a channel-stop implant in said trenches;

depositing a conformal chemical vapor deposited gap-fill silicon oxide to fill said trenches;

chemical/mechanically polishing back said gap-fill silicon oxide to said silicon nitride layer;

removing said silicon nitride layer over said device areas, thereby forming raised dielectric studs in said trenches extending above said substrate surface;

depositing a spin-on glass by spin coating thereby forming disposable spin-on glass spacers on said raised dielectric studs;

curing said spin-on glass by thermal annealing;

wet etching back said spin-on glass and said pad oxide to said device areas and concurrently etching back said raised dielectric studs and said spin-on glass spacers thereby completing said shallow trench isolation regions having a convex raised surface relative to said substrate surface.

2. The method of claim 1, wherein said pad oxide layer has a thickness of between about 200 and 300 Angstroms.

3. The method of claim 1, wherein said silicon nitride layer has a thickness of between about 1500 and 3000 Angstroms.

4. The method of claim 1, wherein said trenches are etched to a depth of between about 3000 and 6000 Angstroms in said substrate.

5. The method of claim 1, wherein said liner oxide is grown to a thickness of between about 50 and 300 Angstroms.

6. The method of claim 1, wherein said channel-stop implant species is boron at a dose sufficient to provide electrical isolation between said device areas.

7. The method of claim 1, wherein said gap-fill silicon oxide is deposited to a thickness at least one-half the width of said trenches.

8. The method of claim 1, wherein said silicon nitride layer is removed in a hot phosphoric acid etch.

9. The method of claim 1, wherein said raised dielectric studs extend above said substrate surface by about the thickness of said silicon nitride layer.

10. The method of claim 1, wherein said spin-on glass is deposited to a thickness of between about 200 and 1000 Angstroms over said device areas, while forming a thicker layer on sidewalls of said raised dielectric studs.

11. The method of claim 1, wherein said curing of said spin-on glass is carried out at a temperature in the range of between about 200° and 500° C.

12. The method of claim 1, wherein said wet etching back of said spin-on glass and said pad oxide is carried out in a dilute solution of hydrofluoric acid.

13. A method for fabricating raised shallow trench isolation regions in a semiconductor substrate, and gate electrodes for field effect transistors comprising the steps of:

forming a pad oxide layer composed of silicon oxide on said substrate;

depositing a silicon nitride layer on said pad oxide layer;

forming openings in said silicon nitride layer and said pad oxide layer surrounding device areas using a photoresist mask and anisotropic plasma etching;

removing said photoresist mask;

forming trenches by selectively anisotropic plasma etching said silicon substrate in said openings while leaving portions of said silicon nitride layer over said device areas;

forming a liner oxide by thermal oxidation on exposed surfaces of said trenches in said substrate;

forming a channel-stop implant in said trenches;

depositing a conformal chemical vapor deposited gap-fill silicon oxide to fill said trenches;

chemical/mechanically polishing back said gap-fill silicon oxide to said silicon nitride layer;

removing said silicon nitride layer over said device areas, thereby forming raised dielectric studs in said trenches extending above said substrate surface;

depositing a spin-on glass by spin coating thereby forming disposable spin-on glass spacers on said raised dielectric studs;

curing said spin-on glass by thermal annealing;

wet etching back said spin-on glass and said pad oxide to said device areas and concurrently etching back said raised dielectric studs and said spin-on glass spacers thereby forming said shallow trench isolation regions having a convex raised surface relative to said substrate surface;

forming a gate oxide by thermal oxidation on said device areas;

depositing a polysilicon layer on said substrate;

patterning said polysilicon layer and completing said gate electrodes for said field effect transistors.

14. The method of claim 13, wherein said pad oxide layer has a thickness of between about 200 and 300 Angstroms.

15. The method of claim 13, wherein said silicon nitride layer has a thickness of between about 1500 and 3000 Angstroms.

16. The method of claim 13, wherein said trenches are etched to a depth of between about 3000 and 6000 Angstroms in said substrate.

17. The method of claim 13, wherein said liner oxide is grown to a thickness of between about 50 and 300 Angstroms.

18. The method of claim 13, wherein said channel-stop implant species is boron at a dose sufficient to provide electrical isolation between said device areas.

19. The method of claim 13, wherein said gap-fill silicon oxide is deposited to a thickness at least one-half the width of said trenches.

20. The method of claim 13, wherein said silicon nitride layer is removed in a hot phosphoric acid etch.

21. The method of claim 13, wherein said raised dielectric studs extend above said substrate surface by about the thickness of said silicon nitride layer.

22. The method of claim 13, wherein said spin-on glass is deposited to a thickness of between about 200 and 1000 Angstroms over said device areas, while forming a thicker layer on sidewalls of said raised dielectric studs.

23. The method of claim 13, wherein said curing of said spin-on glass is carried out at a temperature in the range of between about 200° and 500° C.

24. The method of claim 13, wherein said wet etching back of said spin-on glass and said pad oxide is carried out in a dilute solution of hydrofluoric acid.

25. The method of claim 13, wherein said gate oxide is grown to a thickness of between about 50 and 200 Angstroms.

26. The method of claim 13, wherein said polysilicon layer is deposited to a thickness of between about 1000 and 3500 Angstroms and is conductively doped.

* * * * *